(12) United States Patent
Sun et al.

(10) Patent No.: US 6,307,169 B1
(45) Date of Patent: Oct. 23, 2001

(54) MICRO-ELECTROMECHANICAL SWITCH

(75) Inventors: Xi-Qing Sun, Chandler; John Michael Parsey, Jr., Phoenix; Jenn-Hwa Huang; Ji-Hai Xu, both of Gilbert, all of AZ (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/495,664

(22) Filed: Feb. 1, 2000

(51) Int. Cl.$^7$ .............................. H01H 57/00; H01P 1/10
(52) U.S. Cl. ......................... 200/181; 333/105; 333/262
(58) Field of Search ........................ 200/181; 361/233; 333/101–108, 262; 73/514.01, 514.39; 257/414–420

(56) References Cited

U.S. PATENT DOCUMENTS

| | | | |
|---|---|---|---|
| 4,673,777 | * | 6/1987 | Bai et al. ........................ 200/61.45 R |
| 4,959,515 | * | 9/1990 | Zavracky et al. ..................... 200/181 |
| 5,258,591 | * | 11/1993 | Buck ..................................... 200/181 |
| 5,367,136 | * | 11/1994 | Buck ..................................... 200/181 |
| 5,619,061 | * | 4/1997 | Goldsmith et al. .............. 257/415 X |
| 5,638,946 | * | 6/1997 | Zavracky ............................. 200/181 |
| 5,652,671 | * | 7/1997 | Knipe et al. ......................... 359/291 |
| 6,046,659 | * | 4/2000 | Loo et al. ............................ 333/262 |
| 6,072,686 | * | 6/2000 | Yarbrough ........................... 200/417 |
| 6,115,231 | * | 9/2000 | Shirakawa ....................... 200/181 X |
| 6,139,464 | * | 10/2000 | Carr .................................... 257/417 |
| 6,153,839 | * | 11/2000 | Zavracky et al. .................... 200/181 |

* cited by examiner

*Primary Examiner*—J. R. Scott
(74) *Attorney, Agent, or Firm*—Rennie William Dover

(57) ABSTRACT

A Micro-Electromechanical System (MEMS) switch (100) having a single, center hinge (120) which supports a membrane-type electrode (104) on a substrate (101). The single, center hinge (120) has a control electrode (104) coupled to the substrate (101) by an anchor (113), a hinge collar (121), a set of hinge arms (122, 123). The control electrode (104) has a shorting bar (106) coupled thereto and is electrically isolated from another control electrode (105), which is formed on the substrate (101). A travel stop (130) is positioned between the substrate and the control electrode (104). Another aspect of the present invention is a Single Pole, Double Throw (SPDT) switch (160) into which is incorporated the single, center hinge (170) and the travel stop (185, 186).

18 Claims, 2 Drawing Sheets

MICRO-ELECTROMECHANICAL SWITCH

CROSS-REFERENCE TO RELATED APPLICATIONS

This application is related to the U.S. patent application Ser. No. 09/495,786 entitled "MICRO-ELECTROMECHANICAL SYSTEM DEVICE," filed concurrently with the present application, and which has at least one common co-inventor and is assigned to the same assignee as the present application. The related application is incorporated by reference into the present application.

FIELD OF THE INVENTION

The present invention relates, in general, to Micro-electromechanical System (MEMS) devices and, more particularly, to MEMS switching devices.

BACKGROUND OF THE INVENTION

Switching devices are used in electronic applications to connect and disconnect electrical signal paths. One type of switching device that is useful in Radio Frequency (RF) and microwave applications is a Micro-electromechanical (MEMS) switch because of its low insertion loss and high isolation capability compared to transistor switches. In U.S. Pat. No. 5,619,061, Goldsmith et al. disclose a MEMS switch having a double hinge membrane-type control electrode with center flex. The membrane-type electrode is generally rectangular in shape having two ends. Each end of the electrode is hinged or anchored to a post, spacer, via or other type of stationary vertical structure. Thus, when the appropriate voltage is applied between the two control electrodes, the membrane-type hinged electrode flexes at the center, i.e., between the two hinges, in the direction of the opposite electrode, thereby closing the circuit. When the voltage is removed, the natural resiliency of the membrane-type electrode returns it to its normally horizontal, open state.

A double hinge structure for a digital micro-mirror device (DMD) is disclosed in U.S. Pat. No. 5,652,671. Rather than an electrical switch, a DMD is a light switch in which a micro-mirror either reflects light to, or deflects light from, an image plane, depending on the orientation of the mirror. This patent illustrates a double hinge torsion flex structure formed by the support posts, alumina layer, aluminum layer and mirror. A torsion moment, i.e. a twisting of the hinge, is used to orient the mirror for either reflection or deflection, i.e., partial rotation about the hinges, rather than a downward flexing moment. This configuration is similar to the double hinge cantilever approach discussed hereinbefore, which also depends on a torsion moment.

The drawbacks of the double hinge approach manifest themselves in at least two ways, i.e. thermal stress and unpredictable bi-stable states. The double hinge electrode is typically comprised of a metal layer, which carries a voltage potential, and a dielectric layer for restricting electric current and providing support to the flexible membrane. As the two layers, each with a unique thermal coefficient, expand and contract over temperature variation during operation, thermal stresses within each of the layers are created. Mechanical failure due to thermal stress typically occurs at the hinge because this is where the electrode is anchored and the stresses are concentrated. Thus, thermal expansion and contraction is restricted by the hinge.

Also, because the thermal expansion coefficients between the metal layer and the dielectric layer are dissimilar, the two layers expand and contract at different rates which results in a large thermal stress at the interface between the layers. Again, the most vulnerable point along the interface is at the hinges, where movement is restricted from the expansion and contraction of opposing forces.

Another failure mechanism common to double hinge micro electromechanical switches is an unpredictable bi-stable state formed by excess compressive stress after removal of a sacrificial layer between the upper and lower electrodes. During fabrication, a sacrificial or spacer layer is situated between the two control electrodes to provide the proper distance or spacing between the electrodes. Upon removal of the sacrificial layer, the membrane-type upper electrode may experience an unpredictable bowing phenomenon, primarily as a result of the differential stresses. If bowing in the downward direction occurs, the switch is permanently closed and is therefore unusable. If bowing in the upward direction occurs, one of two results is possible: either the switch is permanently open because an excessive actuation voltage is required or the switch will permanently close on the first application of the actuation voltage. In either case, the switch is unusable.

Stiction is another problem occurring in micro electromechanical switches. Stiction is defined, for the purposes of the present invention, as an adhesive and/or electro-static attraction between electrodes. Stiction has a negative impact on the switching speed and response of the device. When the voltage potential is removed, the electrodes should separate instantaneously. Any residual, unwanted attraction between electrodes will increase the time for separation, thereby decreasing switching speed. In extreme cases, stiction may bind the MEMS switch in the closed position, thus rendering it inoperable.

Therefore, a need exists for a more robust MEMS switch with increased reliability, reduced stiction, and higher switching speeds.

BRIEF DESCRIPTION OF THE DRAWINGS

For simplicity and clarity of illustration, elements in the drawings are not necessarily drawn to scale, and the same reference numerals in different figures denote the same elements.

DETAILED DESCRIPTION OF THE DRAWINGS

Figure 1:
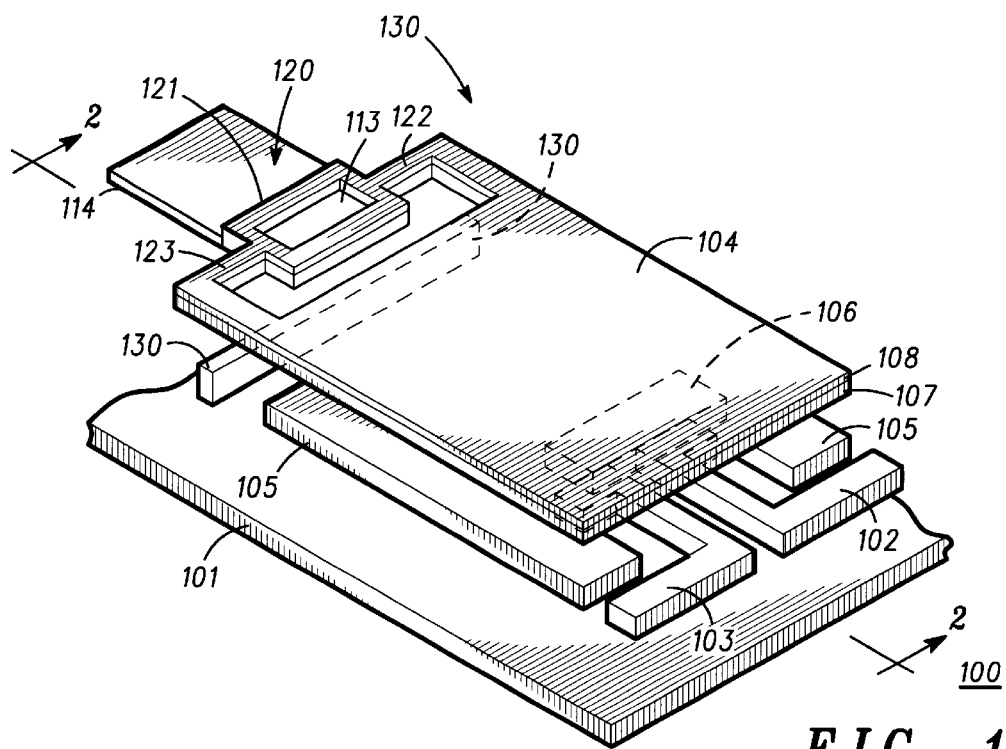
FIG. 1 is a perspective view of a center-hinged MEMS switch in accordance with an embodiment of the present invention.

FIG. 1 is a perspective view of a center-hinged MEMS switch 100 in accordance with an embodiment of the present invention. MEMS switch 100 includes two electrically isolated interconnect structures 102 and 103 and a control electrode 105 formed on a silicon substrate 101. It should be understood that the material of substrate 101 is not limited to being silicon. Other suitable materials for substrate 101 include ceramics, polymers, glass, semiconductor material such as gallium arsenide, or the like. Interconnect structure 102 serves as an input/output terminal and interconnect structure 103 serves as an output/input terminal for transmitting Radio Frequency (RF) or microwave signals through MEMS switch 100.

By way of example, interconnect structures 102 and 103 and control electrode 105 are metal deposited on substrate 101. The geometry of control electrode 105 is designed to optimize charge distribution. Other than a basic rectangular shape, various geometries for control electrode 105 are possible consistent with the goal of supporting adequate charge distribution. Control electrode 105 can extend from near the hinge portion of MEMS switch 100 to past shorting bar 106 and even past the end of control electrode 104. It should be understood that the same metal layer may be used to form interconnect structures 102 and 103 and control electrode 105, unless the application requires a difference in materials between them.

In addition, a center hinge 120 is coupled to silicon substrate 101 via an anchor 113. Anchor 113 is typically a conductively filled via. Center hinge 120 has a hinge collar 121 and hinge arms 122 and 123. Hinge arms 122 and 123 are connected to a control electrode 104. Control electrode 104 is electrically isolated from control electrode 105, but electrically coupled to a control lead 114 via hinge 120 and anchor 113. By way of example, control electrode 104 is comprised of an electrically nonconductive material, i.e., a dielectric material 107 and an electrically conductive material 108. A suitable material for dielectric layer 107 is silicon oxide nitride. Preferably, layer 108 is comprised of a metal having minimum stiffness and a low thermal expansion coefficient such as, for example, copper, gold, or the like. The geometry of control electrode 104 may vary to optimize charge distribution and to optimize the device process. For example, control electrode 104 may contain openings (not shown) to facilitate the etch process. In particular, the end of control electrode 104 may extend beyond shorting bar 106 to achieve more efficient flexing of control electrode 104. By way of example, single, center hinge 120 and control electrode 104 are formed from the same dielectric and metal layers. The particular materials for layers 107 and 108 are not a limitation of the present invention.

Control lead 114 is typically biased with a Direct Current (DC) voltage and may be fabricated from the same metal layer as interconnect structures 102 and 103 and control electrode 105 or from a different conductive material. Control electrodes 104 and 105 form a cantilever structure, wherein control electrode 105 is referred to as a lower control electrode and control electrode 104 is referred to as an upper control electrode.

A shorting bar 106 is connected to control electrode 104 for shorting interconnect structure 102 to interconnect structure 103. Thus, shorting bar 106 is positioned over interconnect structures 102 and 103. Because there is metal to metal contact between shorting bar 106 and interconnect structures 102 and 103, it is preferred that shorting bar 106 and interconnect structures 102 and 103 be made of different metals. The different metals should each possess a high melting point to reduce stiction and each should be resistant to oxidation to promote reliability.

Optionally, a travel stop 130 is formed on silicon substrate 101 to increase the performance of MEMS switch 100 by preventing physical contact between control electrode 104 and control electrode 105. This prevents stiction, resulting in a faster switching speed. Preferably, travel stop 130 is bounded laterally by anchor 113 and lower control electrode 105 and vertically by silicon substrate 101 and control electrode 104. Travel stop 130 also promotes a more complete and planar contact between shorting bar 106 and interconnect structures 102 and 103. For example, when travel stop 130 is not included and an actuation voltage is applied to control electrode 104, control electrode 104 becomes hyper-flexed in the direction of control electrode 105. The hyper-flexion results in non-planar contact between shorting bar 106 and interconnect structures 102 and 103. This may increase the potential for arcing between shorting bar 106 and interconnect structures 102 and 103, which decreases the reliability of MEMS switch 100. Non-planar contact also increases the electrical resistance, which degrades the performance of the switch. Because travel stop 130 limits the movement of control electrode 104, it reduces the stress placed on hinge 120, which further improves the reliability of MEMS switch 100.

Figure 4:
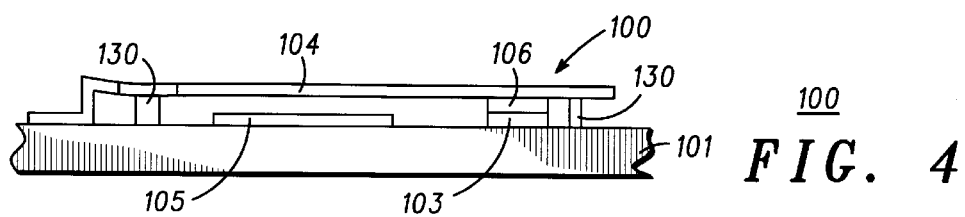
FIG. 4 is a cross-section side view of a MEMS switch in accordance with the present invention, wherein a travel stop is located under an end of a control electrode.

Dimensionally, travel stop 130 has approximately the same height as the combined heights of shorting bar 106 and interconnect structures 102 and 103. Preferably, travel stop 130 is fabricated from metal, but because they have a purely mechanical function, other materials such as, for example, dielectric materials may be used. It should be understood that the number of travel stops is not a limitation of the present invention. For example, MEMS switch 100 could have an additional travel stop located between control electrode 105 and interconnect structures 102 and 103, or an additional travel stop located under or proximal to an end of control electrode 104 as illustrated in FIG. 4. Moreover, travel stop 130 need not be contiguous across the entire breadth of MEMS switch 100, but it may only be in locations where contact is desired. In another embodiment, travel stops 130 are interweaved with control electrode 105 and interconnect structures 102 and 103.

Figure 5:
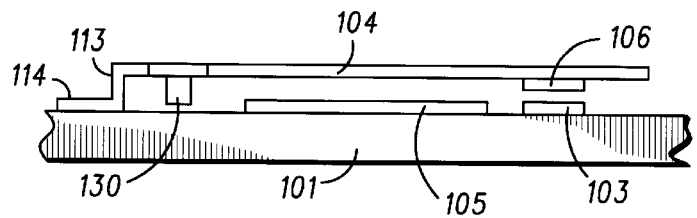
FIG. 5 is a cross-section side view of a MEMS switch in accordance with the present invention, wherein a travel stop is located on a surface of a control electrode.

In yet another embodiment, travel stop 130 may be located on the lower or under surface of control electrode 104, in addition to or in lieu of, locating travel stop 130 on substrate 101 as shown in FIG. 5. In this embodiment, travel stop 130 contacts substrate 101 when the actuation voltage is applied, thereby limiting the movement of control electrode 104 and preventing contact between control electrode 104 and control electrode 105. Travel stop 130 breaks contact with substrate 101 when the actuation voltage is removed.

Figure 2:
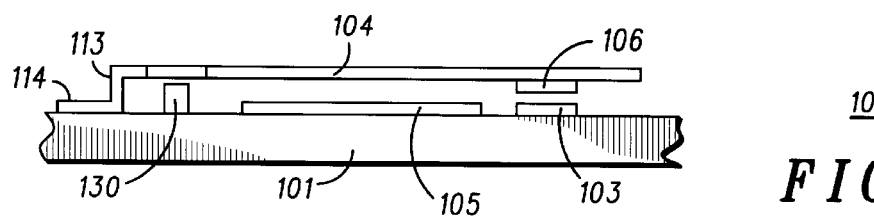
FIG. 2 is a cross-sectional side view of the MEMS switch of FIG. 1 in an open position.

FIG. 2 is a cross-sectional side view of MEMS switch 100 in an open position. It should be noted that in the open position, control electrode 104 is not in contact with travel stop 130 and shorting bar 106 is spaced apart from terminals 102 and 103.

Figure 3:
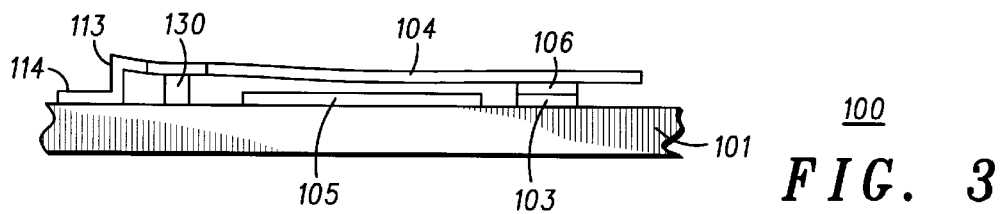
FIG. 3 is a cross-sectional side view of the MEMS switch of FIG. 1 in a closed position.

FIG. 3 is a cross-sectional side view of MEMS switch 100 in a closed position in which control electrode 104, having membrane characteristics, is flexed downward. In this position, shorting bar 106 is electrically connected to terminals 102 and 103. Although control electrode 104 is shown as being in contact with travel stop 130, it should be understood this may not always occur when MEMS switch 100 is in the closed position.

In operation, a ground potential is coupled to control electrode 105 and a voltage in the range of, for example, 30–40 volts DC is applied to control electrode 104 via control lead 114. The electro-static attraction between control electrode 104 and control electrode 105 forces a torsion moment along hinge arms 122 and 123, control electrode 104, and hinge collar 121, thereby causing control electrode 104 to flex downward. It should be understood that the actual voltages applied to electrodes 104 and 105 are not limitations of the present invention. Typical actuation voltages, i.e., the voltages applied to control lead 114, and thereby to control electrode 104, to effect flexing of control electrode 104, may range from, for example, 20 to 50 volts depending on the geometry and composition of control electrodes 104 and 105, as well as the spacing or distance between control electrode 104 and 105 in the absence of the actuation voltage.

Figure 6:
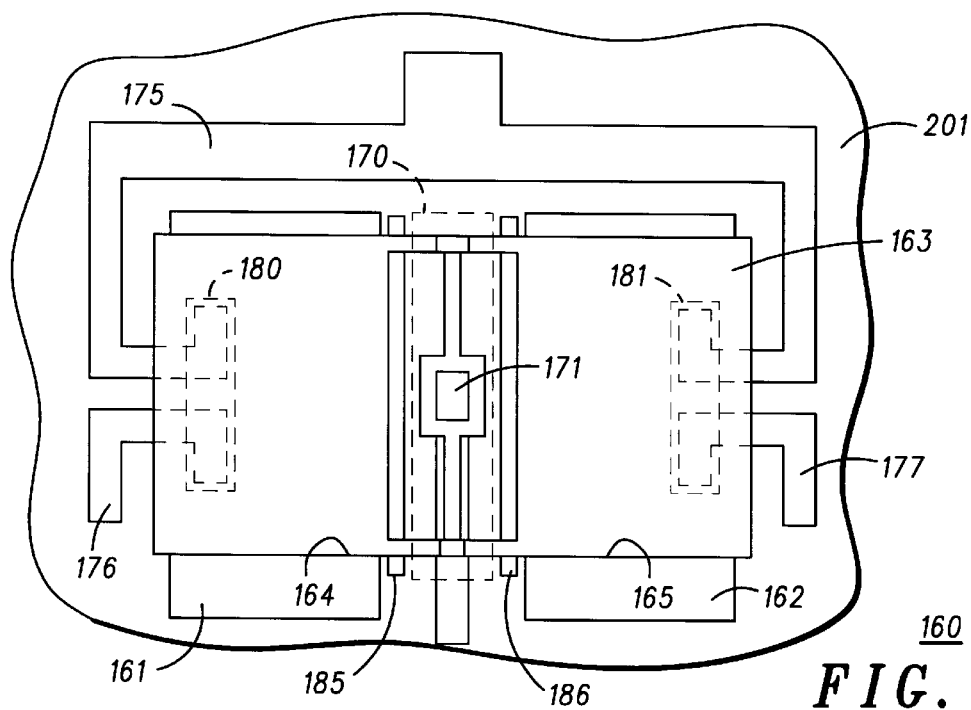
FIG. 6 is a top view of a MEMS switch in accordance with another embodiment of the present invention.

FIG. 6 is a top view of a MEMS switch 160 in accordance with a Single Pole, Double Throw (SPDT) embodiment of the present invention. Switch 160 comprises two electrically isolated control electrodes 161 and 162. Also, MEMS switch 160 has a control electrode 163 comprised of a cantilever section 164 and a cantilever section 165, wherein control electrode 163 is electrically isolated from control electrodes 161 and 162. A single, center hinge 170 is connected to cantilever sections 164 and 165 and to an anchor 171.

Also included in MEMS switch 160 is at least one input terminal 175 and output terminals 176 and 177. A shorting bar 180 is connected to cantilever section 164 for shorting an electrical signal path between input terminal 175 and output terminal 176. A shorting bar 181 is connected to cantilever section 165 for shorting an electrical signal path between input terminal 175 and output terminal 177.

Optionally, MEMS switch 160 includes a travel stop 185 for limiting the movement of cantilever section 164 and a travel stop 186 for limiting the movement of cantilever section 165. The components listed hereinbefore are fabricated on a substrate such as, for example, a silicon substrate.

By way of example, in MEMS switch 160 control electrode 163 is coupled to a ground potential and the actuation voltage is applied to control electrodes 161 and 162.

MEMS switch 160 may be desirable when trying to minimize the size of the switching device or when it is necessary to have a single device to simultaneously control two circuits.

The SPDT embodiment 200 of the present invention has several desirable functional and performance related characteristics. Functionally, the SPDT embodiment is an improvement over the Single Pole, Single Throw (SPST) embodiment because it allows for simultaneous control of two circuits, e.g. an RF transmit and RF receive circuit, by one device. With the SPST embodiment, two independent switches would be required to implement similar functions. Furthermore, real estate utilization is optimized with the SPDT embodiment as compared with the SPST embodiment because a single, center hinge supports two, separate cantilevers.

The SPDT embodiment 160 also improves the performance of the micro electro-mechanical switch by enhancing switching speed. The switching speed of the device is determined, in part, by the overall restoring force of the upper double cantilever control electrode 163. The restoring force $F_R$, i.e. the force that restores the cantilever section of the upper double cantilever control electrode to its normal, unflexed position at rest, is the opposite of the sum of the electrostatic force $F_{ES}$ existing between the upper 163 and lower control electrodes 161 and 162 and the mechanical force produced by the torsion moment $F_{TM}$ of the hinge 171. Thus, $F_R = -(F_{ES} + F_{TM})$.

Figure 7:
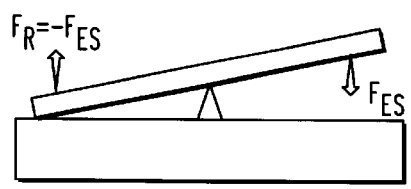
FIG. 7 is a diagram which models the effect of the electrostatic force component on the restoration force for the upper double cantilever control electrode in the SPDT embodiment of the present invention.

Referring to FIG. 7, the electro-static force $F_{ES}$ component of the restoring force $F_R$ is discussed. In simplest terms, the SPDT embodiment can be seen to perform similar to a teeter-totter, wherein one cantilever section is one end of the teeter-totter, the second cantilever section is the opposite end and the hinge is analogous to the fulcrum. When one cantilever section is force down through the application of the actuation voltage, the opposite cantilever section is forced up, i.e., towards the open circuit or restoration position.

Figure 8:
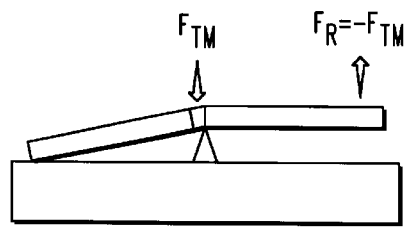
FIG. 8 is a diagram which models the effect of the mechanical force component provided by the torsion moment on the restoration force for the upper double cantilever control electrode in the SPDT embodiment of the present invention.

Referring to FIG. 8, the teeter-totter analogy is extended to explain the contribution of the mechanical force provided by the torsion moment $F_{TM}$ on the hinge to the restoration force $F_R$. In the SPDT embodiment, there is a bending of the upper cantilever section at the hinge arms caused by the torsion moment experienced when one cantilever section flexes downward to close an input/output transmission circuit. This torsion moment will influence the restoring force of the opposite cantilever section by causing an upward force similar in result to that modeled in FIG. 7. The geometry of the hinge and control electrodes may be configured, to maximize the mechanical force provided by the torsion moment and thus, the overall restoring force of the device.

Therefore, the upper double cantilever control electrode 163 of the SPDT embodiment 160 in FIG. 6, reflects an intrinsic cooperative motion as between the two cantilever sections 164 and 165, which is a combination of the electro-static force $F_{ES}$ component and the torsion moment $F_{TM}$.

By now it should be appreciated that MEMS devices have been provided that are cost efficient and easily integrable into a manufacturing process have been provided. Unlike the double hinges of the prior art which have constraining anchors/hinges at each end, single center hinge 120 in accordance with the present invention is not subject to the opposing forces caused by the differing thermal coefficients of the dielectric material and the conductive material comprising control electrodes 104 and 141. Furthermore, the single, center hinge structure of the present invention solves the prior art problem of the unpredictable bistable state that occurs upon removal of the sacrificial layer because it is not subject to the constraining anchors/hinges at each end of the upper control electrode as in the prior art. Therefore, the single, center hinge MEMS device, which is not subject to the limitations of the prior art, provides for a more durable and reliable MEMS switch.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, an additional control electrode can be fabricated on substrate 101. Further, control electrode 104 can be manufactured from a conductive material other than metal.

What is claimed is:

1. A Micro Electro-Mechanical System (MEMS) switch, comprising:

a substrate;

a first control electrode disposed on the substrate;

a single, center hinge extending from the substrate; and a second control electrode coupled to the single, center hinge and electrically isolated from the first control electrode wherein the single, center hinge comprises, an anchor having a hinge collar coupled to the anchor, and at least one hinge arm coupled to the hinge collar and coupled to the second control electrode.

2. The MEMS switch of claim 1, further including a shorting bar coupled to the second control electrode.

3. The MEMS switch of claim 1, wherein the at least one hinge arm comprises two hinge arms and wherein a first of the two hinge arms is coupled to one side of the hinge collar and a second of the two hinge arms is coupled to a second side of the hinge collar.

4. The MEMS switch of claim 1, further including a plurality of interconnect structures disposed on the substrate, wherein the plurality of interconnect structures are electrically isolated from each other and from the first and second control electrodes when the MEMS switch is in an open state.

5. The MEMS switch of claim 1, further including a control lead coupled to the second control electrode.

6. A Micro Electro-Mechanical System (MEMS) switch, comprising:

a substrate;

a first control electrode disposed on the substrate;

a single, center hinge extending from the substrate;

a second control electrode coupled to the single, center hinge and electrically isolated from the first control electrode; and at least one travel stop for limiting movement of the second control electrode.

7. The MEMS switch of claim 6, wherein the at least one travel stop is located between the first control electrode and the single, center hinge.

8. The MEMS switch of claim 6, wherein the at least one travel stop is coupled to the second control electrode.

9. The MEMS switch of claim 6, wherein the at least one travel stop is coupled to the substrate.

10. The MEMS switch of claim 6, wherein the at least one travel stop is comprised of two travel stops, one of the two travel stops between the first control electrode and the single, center hinge and a second of the two travel stops located proximal to an end of the second control electrode.

11. The MEMS switch of claim 1, wherein the second control electrode comprises a layer of an electrically non-conductive material and a layer of an electrically conductive material.

12. The MEMS switch of claim 11, further including a shorting bar disposed on the layer of the electrically non-conductive material.

13. A Single Pole, Double Throw (SPDT) Microelectromechanical (MEMS) switch, comprising:

a substrate;

first and second control electrodes coupled to the substrate, wherein the first and second control electrodes are electrically isolated from each other;

a single, center hinge extending from the substrate; and third and fourth control electrodes coupled to the single, center hinge and electrically isolated from the first and second control electrodes.

14. The SPDT MEMS switch of claim 13, further including a first shorting bar coupled to the third control electrode and a second shorting bar coupled to the fourth control electrode, the first shorting bar for contacting the first control electrode and the second shorting bar for contacting the second control electrode.

15. The SPDT MEMS switch of claim 13, further including at least one travel stop.

16. The SPDT MEMS switch of claim 15, wherein the at least one travel stop comprises a first travel stop for limiting movement of the third control electrode and a second travel stop for limiting movement of the fourth control electrode.

17. The SPDT MEMS switch of claim 13, wherein the at least one travel stop is disposed on the substrate.

18. The SPDT MEMS switch of claim 13, wherein the single, center hinge further comprises:

an anchor;

a hinge collar coupled to the anchor; and at least one hinge arm coupled to the hinge collar and coupled to the upper control electrode.

* * * * *